(12) United States Patent
Hallmark et al.

(10) Patent No.: US 6,538,583 B1
(45) Date of Patent: Mar. 25, 2003

(54) METHOD AND APPARATUS FOR CONTEXT MODELING

(75) Inventors: Phil Hallmark, Austin, TX (US); Richard Greene, Austin, TX (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/098,997

(22) Filed: Mar. 15, 2002

Related U.S. Application Data

(60) Provisional application No. 60/276,620, filed on Mar. 16, 2001.

(51) Int. Cl.[7] .................................................. H03M 7/00
(52) U.S. Cl. .......................................... 341/51; 341/59
(58) Field of Search ........................... 341/50, 59, 107, 341/58, 51; 382/239

(56) References Cited

U.S. PATENT DOCUMENTS 6,492,916 B1 * 12/2002 Schwartz ..................... 341/59

* cited by examiner

Primary Examiner—Brian Young
(74) Attorney, Agent, or Firm—Samuels, Gauthier & Stevens, LLP

(57) ABSTRACT

A system for encoding and decoding information of a codeblock from a memory buffer that includes a context modeler that receives from the memory buffer the codeblock and divides the codeblock into a plurality of codesegments or decodes a codeblock worth of information from received compressed data. The codesegments includes a plurality of bits. The context modeler processes each of the codesegments individually by determining whether any of the bits need special coding information or decoding. The context modeler outputs coded bits associated with the bits that are coded with the special coding information and context information associated with the coded bits or outputs a codeblock worth of information to the memory buffer. An arithmetic coder receives the context information and coded bits and compresses the coded bits or receives compressed data and decompresses the compressed data to produce context information and coded bits.

37 Claims, 7 Drawing Sheets

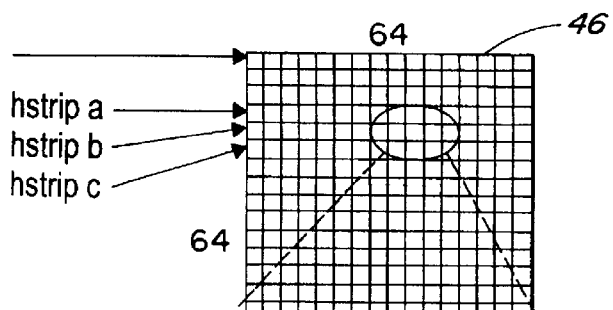

*Fig. 3B* singling out an arbitrary area for further explanation...

|  | 4 |  |  |  |  |
|---|---|---|---|---|---|
| hstrip a | codeseg a3 | codeseg a2<br>*50* | codeseg a1<br>*52* | codeseg a0 | codeseg ax |
| hstrip b | codeseg b3 | codeseg b2 | codeseg b1 | codeseg b0 | codeseg bx |
| hstrip c | codeseg c3 | codeseg c2 | codeseg c1 | codeseg c0 | codeseg cx |

|  | *50* |  |  |  | *52* |  |  |  |
|---|---|---|---|---|---|---|---|---|
| a3:0 | a2:12 | a2:8 | a2:4 | a2:0 | a1:12 | a1:8 | a1:4 | a1:0 | a0:12 |
| b3:3 | b2:15 | b2:11 | b2:7 | b2:3 | b1:15 | b1:11 | b1:7 | b1:3 | b0:15 |
| b3:2 | b2:14 | b2:10 | b2:6 | b2:2 | b1:14 | b1:10 | b1:6 | b1:2 | b0:14 |
| b3:1 | b2:13 | b2:9 | b2:5 | b2:1 | b1:13 | b1:9 | b1:5 | b1:1 | b0:13 |
| b3:0 | b2:12 | b2:8 | b2:4 | b2:0 | b1:12 | b1:8 | b1:4 | b1:0 | b0:12 |
| c3:3 | c2:15 | c2:11 | c2:7 | c2:3 | c1:15 | c1:11 | c1:7 | c1:3 | c0:15 |

CM STAGE 1
CURRENT ACTIVE
CODESEGMENT

CM STAGE 0
NEXT ACTIVE
CODESEGMENT

METHOD AND APPARATUS FOR CONTEXT MODELING

PRIORITY INFORMATION

This application claims priority from provisional application Ser. No. 60/276,620 filed Mar. 16, 2001.

BACKGROUND OF THE INVENTION

The invention relates to the field of context modeling, in particular, a system that reduces the number of clock cycles required to process a codeblock. Context modeling requires intensive computations for providing the proper context for an image, such as JPEG. One of the common tools that provide context modeling is the JPEG 2000. The JPEG 2000 provides processing of various codeblocks by providing code values to certain bits in a code block. In particular, a code block may contain approximately 4096 multi-bit wavelet coefficients. The JPEG 2000 processes each bit individually, thus requiring exhaustive computational resources for coding. For example, it would take approximately (4096×12) coding operations to process all the bits in the codeblock. Also, to determine distortions associated with a code block, it would require further computational resources to compute, thus, limiting the performance of the system.

SUMMARY OF THE INVENTION

Briefly, according to an aspect of the invention, there is provided a system for context modeling which reduces the number of clock cycles required to process a codeblock by considering multiple coefficients per clock cycle. The system divides a codeblock into 4×4 arrays of wavelet coefficients, which are then transformed into contexts and decisions. These context and decisions are sent to an arithmetic coder. Considering the 16 coefficients from each 4×4 array in parallel maximizes the throughput, thus, improving the performance of the system.

According to one aspect of the invention, a system for providing contextual information of a codeblock from a memory buffer is provided.

These and other objects, features and advantages of the present invention will become more apparent in light of the following detailed description of preferred embodiments thereof, as illustrated in the accompanying drawings.

Figure 4:
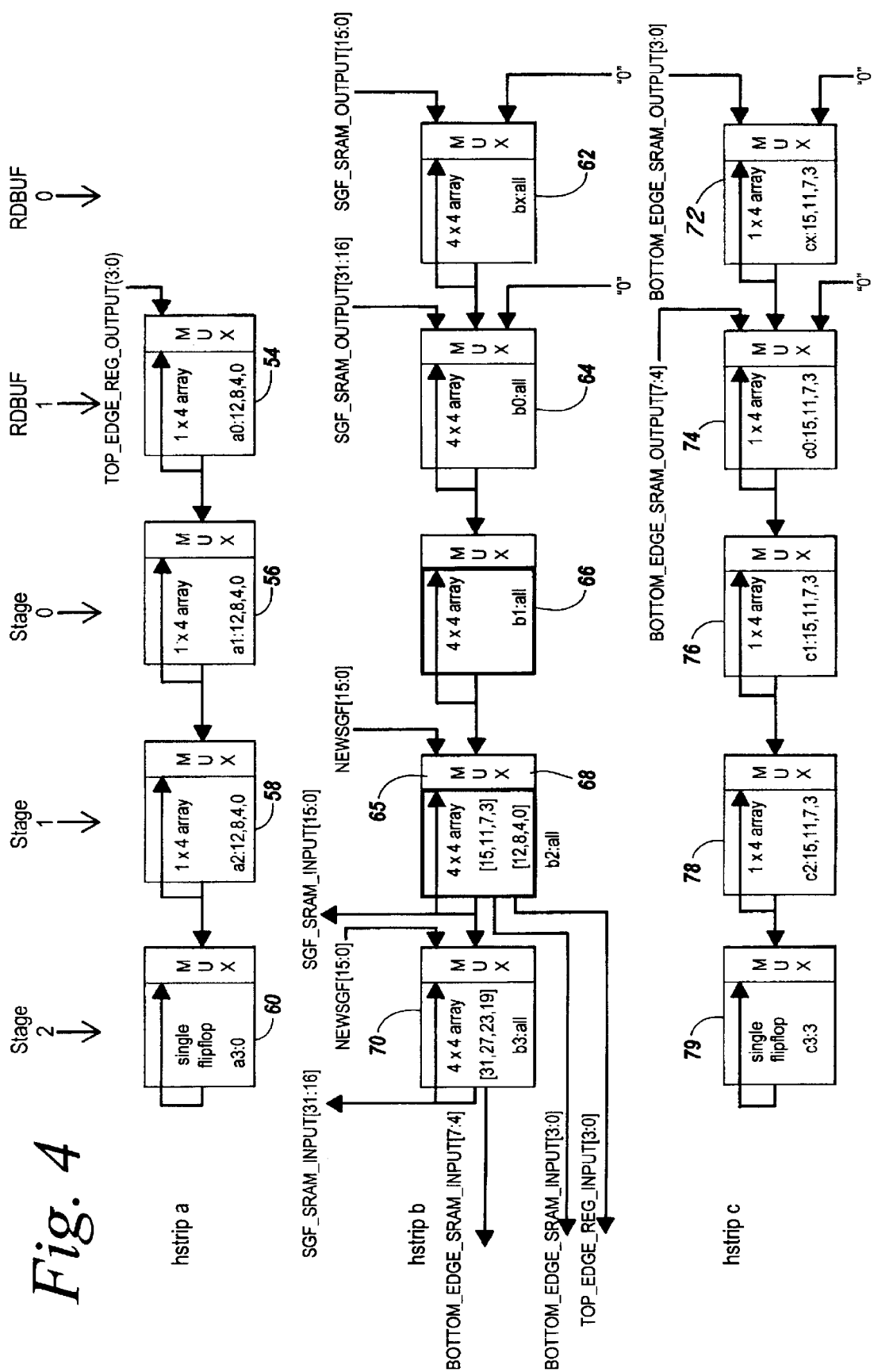
Figure 5:
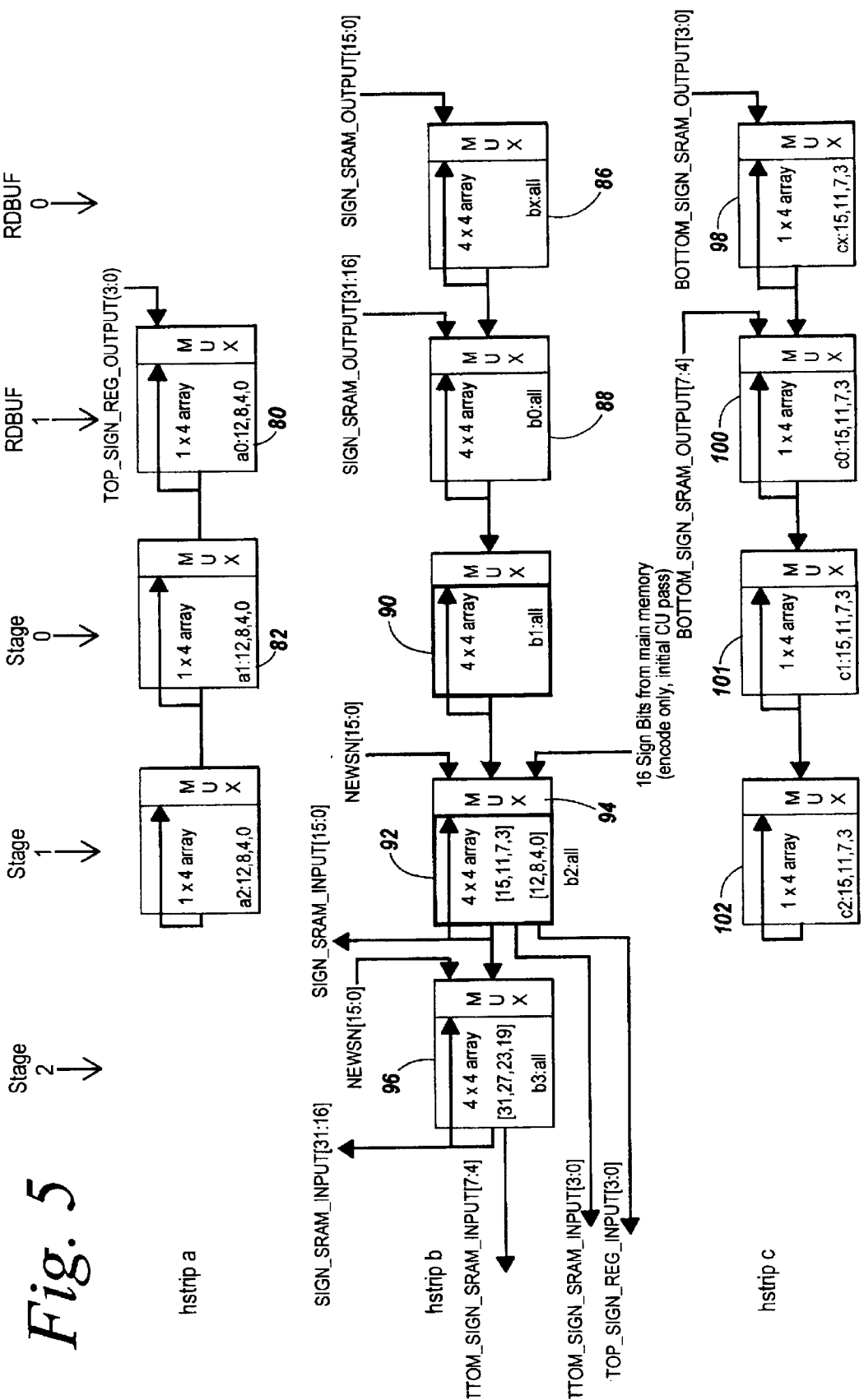

FIG(s). 3A and 3B are detailed schematics of the processing of image data;

FIG. 4 is a dataflow diagram for significance calculations;

FIG. 5 is a dataflow diagram for the computation of sign data; and

Figure 6:
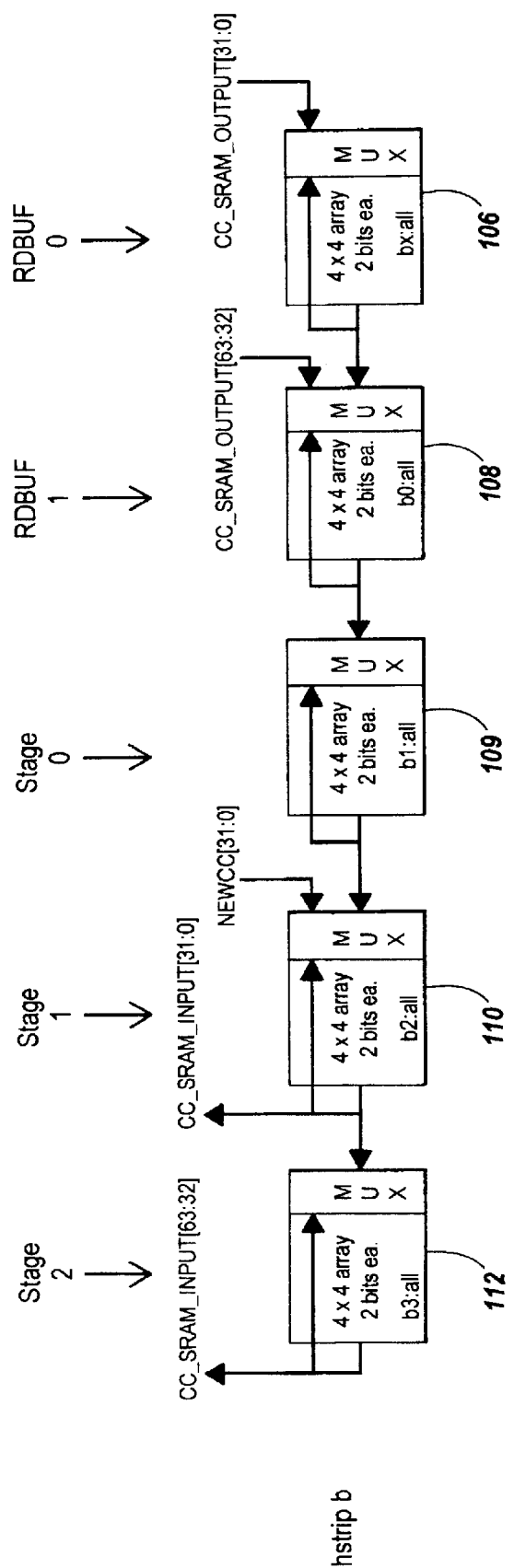

FIG. 6 is a dataflow diagram for providing code control bits to codesegments.

DETAILED DESCRIPTION OF THE INVENTION

Figure 1:
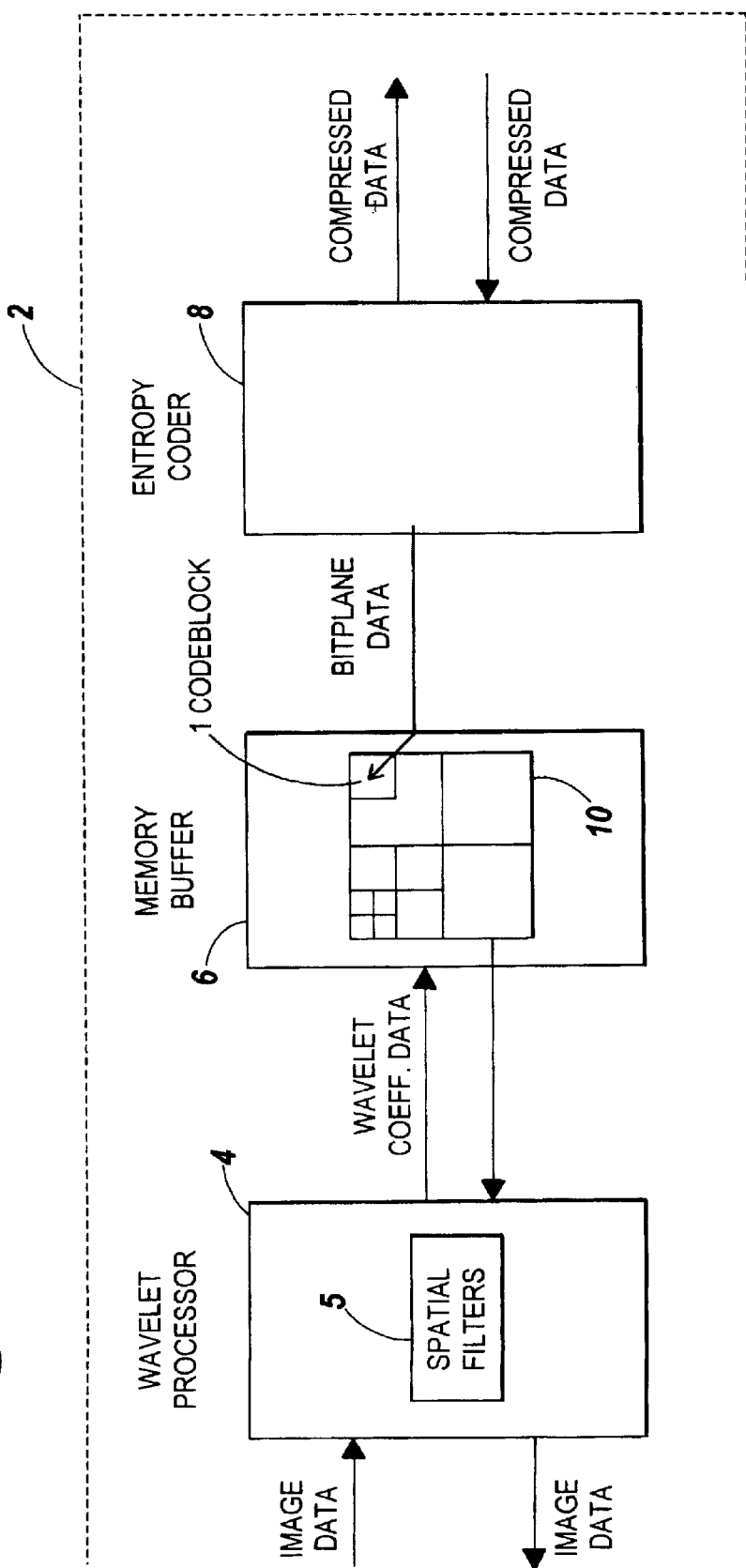
FIG. 1 is a block diagram of the JPEG2000 chip.

FIG. 1 is a block diagram of the JPEG2000 chip. The invention is related to the JPEG2000 chip processing of image data. Chip 2 uses various modules in performing it tasks, such as the wavelet processor 4, memory buffer 6, and entropy coder 8. As shown in FIG. 1, the wavelet processor 4 receives image data. The wavelet processor 4 provides wavelet coefficient data. The wavelet processor 4 calculates the wavelet coefficients for selected portions of the image data. The wavelet coefficient data aid in determining which portion of the image data should be coded with special values, which will be described below. The wavelet processor 4 produces an array of 256×256 tile of wavelet coefficients data. Also, Mallat transforms are used in this embodiment to create the wavelet coefficients, however other transforms may be used to create wavelet coefficients. The wavelet processor 4 uses spatial filters 5 to perform the Mallat transformation, however, other filters or the like may be used to perform other types of transformation to create wavelet coefficient data.

The wavelet processor 4 outputs the wavelet coefficient data to line 10, which is received by memory buffer 6. Memory buffer 6 stores the wavelet coefficient data from the wavelet processor 6 of the whole image data. Also, the memory buffer 6 divides the wavelet coefficient data into in a series of codeblocks. In the illustrative embodiment, the wavelet coefficient data is comprised of 256×256 array of wavelet coefficient values. The memory buffer 6 proceeds to create a codeblock which is sized to be a 64×64 matrix of wavelet coefficient values from the wavelet coefficient data. The memory buffer 6 also outputs each of the codeblock one at a time on line 12, which is received by the entropy coder 8.

The entropy coder 8 allows for fast encode and decode throughput, approximately 1 bit per clock cycle, while maintaining all of the JPEG2000 features. This is accomplished by processing multiple wavelet coefficients associated with a codeblock.

The entropy coder 8 divides each codeblock that it receives into 4×4 arrays of wavelet coefficients, which are then coded. Considering the 16-wavelet coefficients from each 4×4 array in parallel maximizes the throughput. The hardware in chip 2 provides entropy coder 8 the ability to keep track of which coefficients have been coded in a clock cycle, if any. This depends on a number of considerations, including the current significant state of the neighborhood and which pass is currently being processed.

The invention can be improved to increase throughput in a number of ways; for example, by increasing the size of the codesegments to more than 16 wavelet coefficients, instantiating various multiple entropy coders to be described more below, all operating concurrently on different codeblocks, and maintaining a set of status bits in memory which could be used to look ahead and skip over any number of codesegments that do not need processing for the current pass, thus, resulting in even less "wasted clocks" for codesegments that need no coding. For instance, if most coefficients are still insignificant then many clocks could be saved during a pass, during which none of the insignificant wavelet coefficients would be coded.

The invention also performs decoding of compressed data received at the entropy coder 8. The entropy coder 8 decodes the compressed data and performs the necessary operations to produce a codeblock associated with the compressed data.

That codeblock is sent to the memory buffer 6. The memory buffer 6 also stores and recombines other codeblocks that are received from the entropy coder 8, such that an array 10 of 256×256 entries of wavelet coefficients is produced. Once all the necessary wavelet coefficients are added to array 10, the memory buffer 6 provides array 10 to the wavelet processor 4. The wavelet processor 4 performs inverse transformation on the wavelet coefficients stored in the array 10, thus producing image data by using spatial filter 5.

Figure 2:
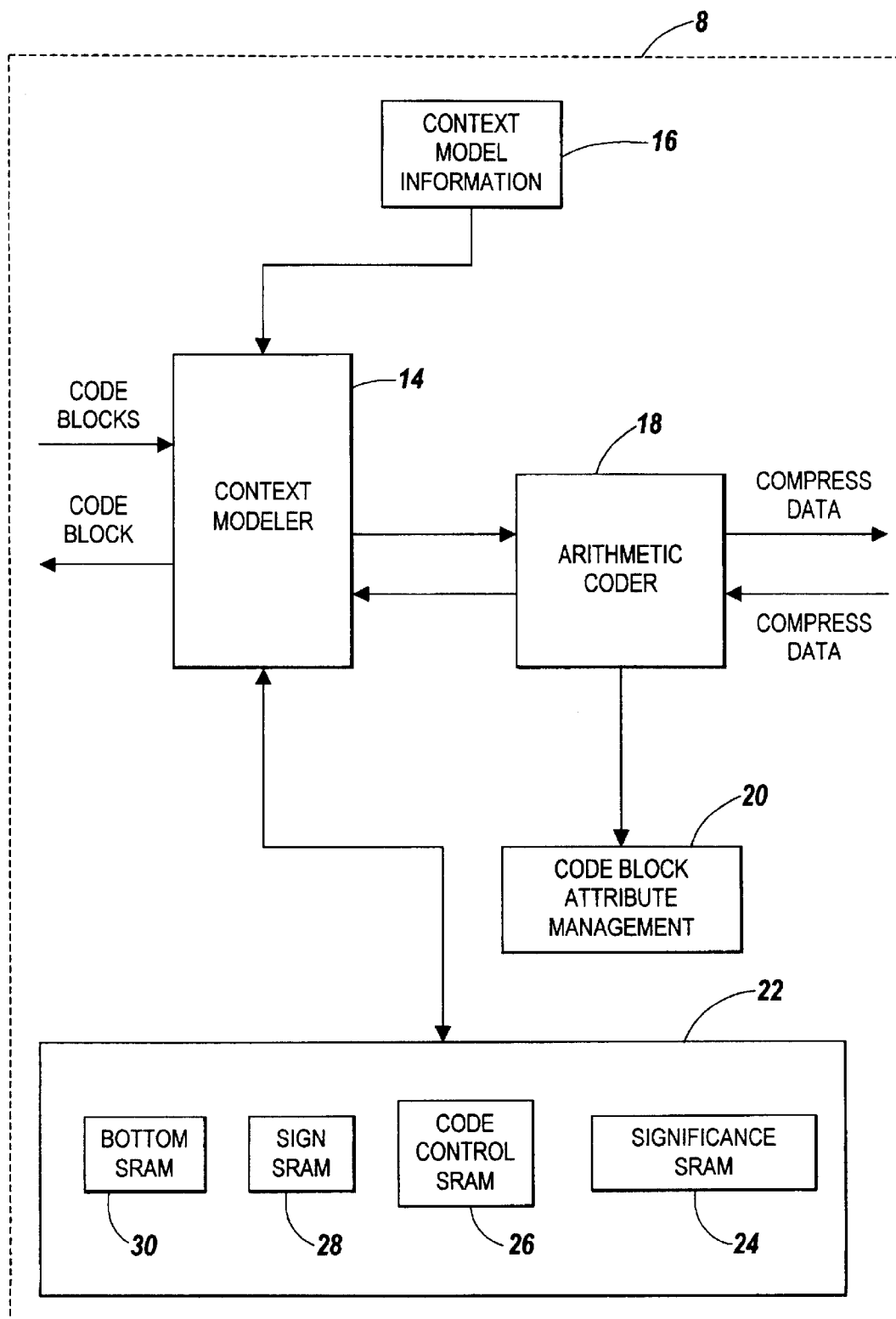
FIG. 2 is a block diagram of the entropy coder.

FIG. 2 is a block diagram of the entropy coder 8. The entropy coder 8 includes a context modeler 14 and arithmetic coder 18. The context modeler 14 provides the entropy coder 8 fast encode and decode throughput while maintaining all of the features of the JPEG2000. This is accomplished, as described above, by processing multiple wavelets coefficients in parallel. Every codeblock received by the entropy coder 8 includes a number of wavelet coefficients calculated by the wavelet processor 4. In this embodiment, the codeblock is an array of 4096 wavelet coefficients. A codeblock size may vary depending on the user needs and performance requirements. For example, a codeblock may be a 1×1 to 64×64 array. Each wavelet coefficient is a multi-bit number stored in signed magnitude (12 bits for chip 2). All the wavelet coefficients are stored in the memory buffer 6.

The context modeler 14 receives a codeblock from the memory buffer 6. The codeblock, in this illustrative embodiment, is obtained from a Mallat structure. The context modeler 14 proceeds to analyze the codeblock carefully by scanning the codeblock in a particular order. Starting at the top left point, the first four wavelet coefficients of the first column are scanned, followed by the second four wavelet coefficients of the second column and so on, until the right side of the code-block is reached. Every bit plane is coded by the context modeler in a 3-pass process; for example, the first pass on a bit plane the coder starts at the top left corner of the codeblock and progresses across and down to the bottom right corner of the codeblock, then starts back at the top left corner for the second pass, and repeats until all three passes are complete for the current bitplane. The one exception is the first (most significant) plane: every bit in this plane is coded with just one pass a cleanup pass. This is called the "initial cleanup pass". All planes after the first one are coded first significance propagation, then magnitude refinement, and finally cleanup.

A wavelet coefficient is termed "significant" for the context modeling process after the first "1" of the wavelet coefficient has been coded. For example, if a wavelet coefficient's 11 magnitude bits are 00001010111, then it will be insignificant until the fifth bit plane is coded, at which point the first 1 encountered and it becomes significant during one of the three coding stages. It will remain significant from that point on. This example also assumes that there are no "leading 0 planes" in the codeblock. In the clock cycle immediately after a coefficient becomes significant, its sign bit is coded before the context modeler 14 proceeds to the next coefficient. Note, that if a wavelet coefficient is all 0's, then it will remain insignificant for the entire codeblock coding process. All wavelet coefficients of a codeblock start out as insignificant, and wavelet coefficients become significant individually as the first "1" in that wavelet coefficient is encountered and coded. Once a wavelet coefficient becomes significant, it remains significant for the remainder of the codeblock coding process, and all subsequent bits of that coefficient are coded during the magnitude refinement passes.

The concept of wavelet coefficient significance is the key to the context modeling process. The significance states of all coefficients must be stored and retrieved over and over as the bit planes are coded. The context modeler 14 uses a 4096-bit SRAM 24 to store significance states, and is written/retrieved in groups of 2 segments at a time. This is to avoid having a dual-port RAM as local storage. If a dual-port RAM is used, then it could be arranged to retrieve a single code-segment per access. Every wavelet coefficient has 1 "significant state" bit in the SRAM 24. Since the maximum codeblock size is 64×64 wavelet coefficients, the significance SRAM 24 must be 4096 bits. In addition to significance information, there must also be memory for sign information and "code control" information. Sign info is needed for coding sign bits—that is, the sign and significance of a wavelet coefficient's neighbors affects the way its sign bit gets coded. The sign SRAM 28 is also 4096 bits—1 bit per wavelet coefficients. The code control SRAM 26 is needed to control a wavelet coefficient that is coded during magnitude refinement passes. Each wavelet coefficient requires 2 bits of code control information, for a total of 8192 code controls SRAM 26 bits. An additional 2048 bits of SRAM 30 is needed to store the "bottom edge" significance and sign information, which will be discussed more below. The total size of the SRAM storage is approximately 18,432 bits (2.3 Kbytes).

The context modeler 14 outputs the coded bit and its associated context to the arithmetic coder 18. The context modeler 14 determines the context of an associated coded bit by analyzing the coded bits significance and its nearest 8 neighbors. The nearest eight neighbors are obtained by retrieving that information from the top edge Register 32 and bottom edge SRAM 30, and the data stages on either side. The context modeler 14 calculates the context based on rules stored in the context model information 16. In this embodiment, the context model information 16 stores information regarding 19 context models. Also, the context model information 16 also provides the necessary rules in selecting the appropriate model for processing. The context provides the necessary adjustment in processing a coded bit based on the factors associated with the coded bit, such as its significance, significance of near neighbors, sign, and code control information.

The context modeler 14 also performs distortion metric for every coded bit. Distortion metric is a measure of how much distortion is removed from the decoded image due to the coded bit being included in a codestream. The distortion may also be considered as a measure of that coded bit's importance to the quality of the image. The context modeler 14 computes this value by retrieving the 6 bit planes after the bit being coded are needed. For example, if bitplane 7 is being coded of the following codesegment

001011010010 then the distortion metric requires the bits 101001. This is very easy in this embodiment since all the bits in the 16 wavelet coefficients are read at the same time. The context modeler 14 sends the distortion metric for the coded bit to the arithmetic coder 18.

The context modeler 14 may access bits from other bit planes to perform distortion metric operations. Also, using the subsequent 6 bitplanes to compute distortion metric values provides very accurate results.

The arithmetic coder 18 receives as input a coded bit, distortion metric and its context. Based on the received information, the arithmetic coder 18 performs compression of the coded bit and outputs the compressed bit to a code stream.

The distortion metric is passed to a codeblock attribute management module 20 that stores a distortion metric of a coded bit. The codeblock attribute management module 20 manages a running tabulation of each of the distortion metric received and sums these distortion metric values of the coded bits associated with a codeblock. The value of the sum is then outputted to a FIFO to be used for decoding, thus allowing the 4×4 codesegment to be skipped.

The movement of data in the context modeler 14 is identical in all three passes and for all bit planes. The context modeler 14 groups the wavelet coefficients into 4×4 codesegments, so that 16 wavelet coefficients are considered during one clock cycle. If all 16 wavelet coefficients happen to need coding during the current pass, then at least 16 clock cycles are required. However, many clock cycles are saved in the event that none of the wavelet coefficients require coding during a current pass. In that case, the 16 coefficients are shifted out in 1 clock cycle instead of 16. Also, memory status bits may be used to establish that such coefficients require no coding.

When the entropy coder 8 is decoding, compressed data is received at the arithmetic coder 18. The arithmetic coder 18 decodes magnitude and sign bit decisions from the compressed data stream using context information provided by the context modeler 14. The decoded bits contain the magnitude and sign information for the coefficients. The arithmetic coder 18 takes as input the context information from the context modeler 14 and outputs the decoded bits to the context modeler 14.

The context modeler 14 outputs the context information to the arithmetic coder 18 in exchange for the decoded bits. The context modeler 14 uses the decoded bits to reconstruct the wavelet coefficients' magnitude and sign, and to build the significance states necessary for proper decoding. This essentially produces various 4×4 codesegments that are stored in memory buffer 6 until a full codeblock worth of information is decoded. Thus, the context modeler 14 outputs the codeblock to memory buffer 6. As described above, the memory buffer 6 and wavelet processor 4 are used to further produce image data. Just as in encode mode, in decode the use of 4×4 codesegments greatly reduces the number of clock cycles required to process a codeblock.

Figure 3A:
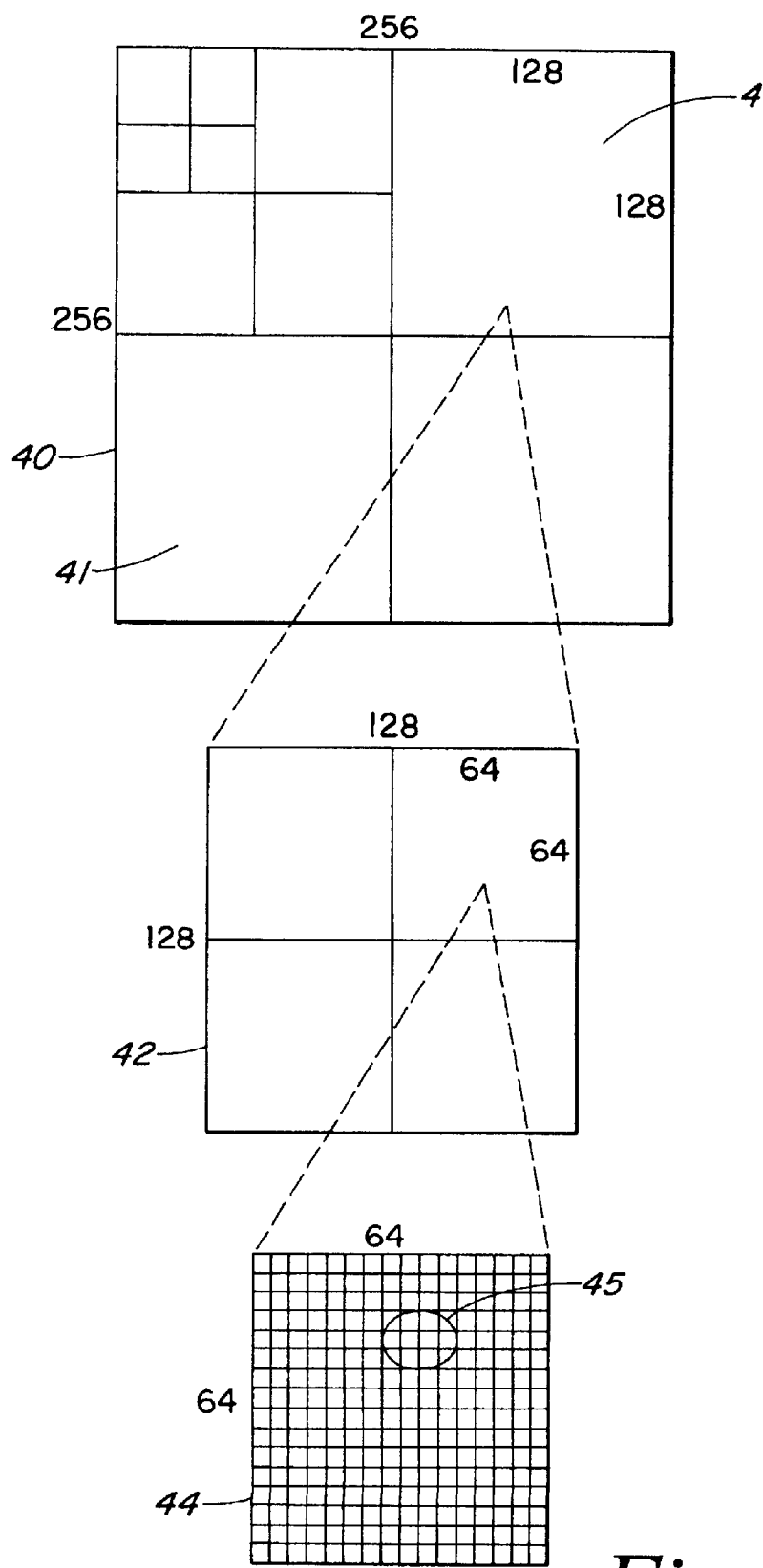

FIG(s). 3A and 3B are detailed schematics of the processing of image data. In FIG. 3A, the structure 40 illustrates a Mallat structure for 256×256 tile. The Mallat structure 40 depicts how an image or tile is divided into spatially filtered frequency sub-bands 41 and 42 by the wavelet transform. The memory buffer 6 further sub-divides the sub-bands 41 and 42 into a codeblock 44. Each codeblock 44 includes a group of up to 4096 wavelet coefficients that are stored in the memory buffer 6 and is readily available to the entropy coder 8. In particular, a 128×128 sub-band 42 is divided into 4-64×64 codeblock 44. In this embodiment, the wavelet coefficients are 12-bit signed magnitude number, but the actual size of the wavelet coefficients may vary depending on the user and system requirements.

Once the entropy coder 8 receives the codeblock 44, the context modeler 14 proceeds to process the codeblock 44. The context modeler 14 further divides the 64×64 codeblock into 256 4×4 codesegments as shown in structure 44. The context modeler progresses across and down the codeblock 44, from the top left corner, to the shaded codesegments 45. The shaded codesegments are used to indicate the current active codesegments being considered by the context modeler 14.

As shown in FIG. 3B, when the processing unit of the context modeler 14 processes a codesegment, in this case codesegment b2, the context modeler 14 decides whether any of the 16 coefficients in codesegment b2 need coding. At the same time, the context modeler 14 is looking ahead into codesegment b1 to see which of its 16 coefficients, if any, requires coding in the event that codesegment b2 has none to code. This keeps the context modeler 14 busy with no "dead time" between codesegments. Thus, improving processing time of codesegments.

In processing a codesegment, the context modeler 14 determines whether a coefficient needs coding by looking at its significance neighborhood. Structure 50 and 52 illustrates a group of codesegments from which all neighborhood information can be assembled for any of the coefficients currently being considered. For instance, if coefficient 15 from codesegment b2 is currently being coded, which is identified as b2:15 in FIG. 3B, then the significance neighborhood for that coefficient includes the significance states of the following 8 surrounding coefficients: a3:0, a2:12, a2:8, b3:3, b2:11, b3:2, b2:14, and b2:10. Thus, a coefficient's neighborhood includes any surrounding coefficient that "touches" the current coefficient.

FIG. 4 is a dataflow diagram for the computation of significance data. The context modeler 14 computes magnitude and significance decisions and contexts for every coefficient of a codeblock. The context modeler 14 computes significance decision and context for a codesegment in 2 stages referred in FIG. 4 as stage 0 and stage 1. Also, the context modeler 14 reads two codesegments simultaneously at "read buffers" RDBUF 0 and RDBUF 1. The context modeler 14 reads codesegments from left to right. In this illustrative embodiment, codesegments b3, b2, b1, b0, and bx, as shown in FIG. 3B, are those being processed for coding significance data. Also, hstrips a, b, and c are also those referred in FIG. 3B. The hstrips a and c provide the necessary neighborhood coefficients needed in computing significance decision and context. Significance data are loaded from significance SRAM 24 into the pipe from buses SGF_SRAM_OUTPUT.

Referring to FIG. 4, the significance data regarding codesegments b0 and bx are loaded from buses SGF_SRAM_OUTPUT at RDBUF 1 and RDBUF 0, respectively. Given that codesegments b0 and bx are the rightmost codesegments and the context modeler 14 reads from left to right, significance data regarding codesegments b3, b2, and b1 have already been loaded and progressed up the stage in sequential fashion. In this case, codesegment b3 is completed and codesegments b2 and b1 are currently in active stages 1 and 0, respectively. As preceding codesegments complete processing, those codesegments remaining progress to the left one stage. At each stage, there are various computations and analysis done for each codesegment. Also, as each codesegment progresses to the left by one stage, the codesegment's top and bottom neighbors progress respectively. For example, at stage 1 where the codesegment b2 is being processed, the top neighbors (a2:12, 8, 4, 0) for codesegment b2 are also at stage 1 and bottom neighborhoods (c2:15, 11, 7, 3) are also at stage 1. The same is for codesegment b1 where its top neighbors significance data is at stage level 0.

In accessing significance data of top neighbors of a codesegment, the context modeler 14 uses four mechanized steps. The context modeler 14 uses RDBUF 1, stage 0 and 1. The top neighborhood utilizes several 1×4 memory arrays 54, 56, and 58 and flip-flop 60. These memory arrays 54, 56, and 58 allow for the storage and transitioning of data to the various points of accessing significance data in hstrip a. Each of the memory arrays 54, 56, and 58 also includes a multiplexer (MUX). The multiplexer provides the ability to maintain significance data associated with a codesegment or shift new input into the arrays associated with a new codesegment. Flip-flop 60 stores the leftmost top significance data.

At RDBUF 1, the context modeler 14 retrieves from the TOP_EDGE_REG_OUTPUT the top neighbors of the codesegment at the same respective point in the processing occurring at hstrip b. Referring to FIG. 4, codesegment b0 is located at point RDBUF 1 in the processing of significance data at hstrip b, thus at the same point in the accessing of hstrip a significance data of top neighbors a0:12,8,4,0 are inputted into the memory array 54.

At stage 0, the memory array 56 acts like a buffer and stores the significance data received from RDBUF 1. This information will be passed on to the memory array 58 of stage 1.

At stage 1, the context modeler 14 uses the significance data of the top neighbors stored in the memory array 58 for neighborhood generation for that codesegment that is also in stage 1 for the processing on the hstrip b. Referring to FIG. 4, the top neighbors a2:12, 8, 4, 0 are associated with the codesegment b2.

At stage 2, the context modeler 14 stores the top leftmost diagonal significance data for that codesegment that is in stage 1 for the processing on the hstrip b. Referring to FIG. 4, the top leftmost codesegment for b2 is a3:0, which is associated with the significance data stored in flip-flop 60.

In processing the codesegments in hstrip b, the context modeler 14 uses five different steps to process significance data for codesegments. In particular, the context modeler 14 uses two read buffers RDBUF 0 AND RDBUF 1. The read buffers RDBUF0, RDBUF1 include 4×4 memory arrays 62, 64, respectively. The memory arrays 62, 64 are designed to store a codesegment. In processing the hstrip b for significance data, two adjacent codesegments are loaded simultaneously. In this case, FIG. 4 demonstrates codesegment b0 being loaded in RDBUF 1 and codesegment bx being loaded in RDBUF 0. There are no systems in the prior art that loads two simultaneous codesegments in one clock. This alleviates the need for a dual-port local storage SRAM.

At stage 0 for the processing of significance data on hstrip b, the context modeler 14 shifts over the codesegment that was stored in RDBUF 1 and to the 4×4 memory array 66 in stage 0. This information will be passed on to the memory array 68 of stage 1.

At stage 1 of significance data processing on hstrip b, the context modeler 14 provides the new significance data by way of NEWSGF bus. However, if the codesegment does not require any.significance data coding, then there is no calculation of significance data for that codesegment is performed. Note that the multiplexer 65 of the memory array 68 in stage 1 receives two inputs NEWSGF and codesegment significance data from stage 0. Also, the memory array 68 of stage 1 also outputs the new significance data to the significance SRAM 24 by way of bus SGF_SRAM_INPUT. The memory array 68 also outputs bottom edge significance data to the bottom edge SRAM 30 by way of the BOTTOM_EDGE_SRAM_INPUT bus. Note that the bottom edge SRAM 30 gets the TOP edge significance data of the current hstrip and top edge REGISTER 32 get the bottom edge of the current hstrip. These edges will be used on the neighboring hstrips. Once stage 1 is finished performing its processing and stage 2 shifts out its current contents, and the current contents in stage 1 are shifted to stage 2 simultaneously. In this case, FIG. 4 demonstrates codesegment b2 in stage 1 where memory array 68 outputs the top edge of codesegment b2 to the bottom edge SRAM 30 by way of the BOTTOM_EDGE_SRAM_INPUT bus. Also, the memory array 68 also outputs the bottom edge of codesegment b2 to the top edge Register 32 by way of the TOP_EDGE_REG_INPUT bus.

At stage 2 on hstrip b, the content that includes the codesegment in stage 1 that has been coded with significance data is received and stored in the memory array 70. The stage 2 is used to hold the previous codesegment's significance data information until there are 2 codesegments worth of data to write to the significance SRAM 24 and bottom edge SRAM 30 to avoid the requirement of a dual port SRAM. In this case, the codesegment b3 is in stage 2. The memory array 70 in stage 2 outputs it previously calculated significance data associated with codesegment b3 to the significance SRAM 24 and bottom significance data to the bottom edge SRAM 30. As shown, significance data associated with codesegment b3 is inputted to the significance SRAM 24 by way of the SGF_SRAM_INPUT, and the bottom edge significance data is inputted to the bottom edge SRAM 30 by way of the bus BOTTOM_EDGE_SRAM_INPUT.

In accessing bottom edge significance data at hstrip c, the context modeler 14 uses 4 arrays 72, 74, 76, and 78 an flip-flop 79 to provide bottom edge significance data for computing significance data for a particular codesegment in stage 1 in the processing performed on hstrip b. The accessing at hstrip c includes two read buffers RDBUF 0 and RDBUF 1. Each of the read buffers RDBUF 0 and RDBUF 1 include 1×4 memory arrays 74. 72. The information provided to read buffers RDBUF 1 and RDBUF 0 is from the bottom edge SRAM 30. Each of these read buffer RDBUF 1 and RDBUF 0 receive bottom edge significance data of each codesegment that are in stages RDBUF 1 and RDBUF 0 in hstrip b, respectively, thus correlating the bottom edge significance data to its respective codesegment. FIG. 4 shows read buffer RDBUF 0 storing the bottom edge significance data of codesegment cx, wherein in hstrip b read RDBUF 0 stores codesegment bx. As the each codesegment shifts up the various stages in hstrip b, it associated bottom edge significance data also shifts in hstrip c. For example, in stage 0 in hstrip b contains the codesegment b1, while in stage 0 in hstrip c contains the bottom edge significance data for codesegment c1.

At stage 0, the memory array 76 acts like a buffer and stores the significance data received from RDBUF 1. This information will be passed on to the memory array 78 of stage 1.

At stage 1, the context modeler 14 uses the significance data of the bottom edge neighbors stored in the memory array 78 to compute new significance data for that codesegment that is also in stage 1 for the processing on the hstrip b. Referring to FIG. 4, the top neighbors a2:12, 8, 4, 0 and bottom neighbors c2:15, 11, 7, 3 are associated with the codesegment b2.

At stage 2, the context modeler 14 stores the bottom leftmost diagonal significance data for that codesegment that is also in stage 2 for the processing on the hstrip b. Referring to FIG. 4, the bottom leftmost diagonal codesegment for b2 is c3:3, which is associated with the significance data stored in flip-flop 79.

In addition to significance information, the actual magnitude bits for the coefficients are needed as a codesegment is being processed. This information is read from the memory buffer system 6 on a codesegment basis and is available to stage 1 as it processes a codesegment. The mechanism is not shown in these diagrams, but the data is read ahead of time and shifted along, similar to the significance information. This alleviates any speed path issues for getting data out of memory buffer 6 and into the context modeler 14. When a certain bit plane is requested from the memory buffer 6, several bit planes below the one being accessed are also passed in the entropy coder 8. This allows distortion metric calculation "on the fly" as a codeblock is being processed, which is an improvement over prior art implementations. Also, magnitude bits are read for the entire 4×4 codesegment on every memory buffer access. This feature increases throughput even more. This is accomplished by allowing an entire 4×4 codesegment to be processed in 1 cycle during arithmetic coder 18 bypass mode. The current JPEG2000 chip requires 1 cycle per processed bit during arithmetic coder bypass, as if the bit were actually being coded like in all other passes.

In FIG. 3B, the top edge neighborhood of hstrip b is the bottom edge of hstrip a, and the bottom edge neighborhood of hstrip b is the top edge of hstrip c. So, as hstrip a is being processed, its bottom edge significance information is being stored in a 64 bit flip-flop 79 based register, to be used to immediately on the next hstrip as the top edge neighborhood. This is seen as the TOP_EDGE_REG_INPUT bus, and later, as hstrip c is being processed, its top edge is being stored off in the edge SRAM 30 to be retrieved during the NEXT pass when hstrip b is the current hstrip. This is seen as the BOTTOM_EDGE_SRAM_INPUT busses. The top and bottom edge data stages are in FIG. 4. The bottom edge SRAM 30 is organized in a similar fashion to the regular SRAM, that is, 2 codesegments' worth of info is retrieved per access. The top edge neighborhood is a simpler problem. Since the top edge neighborhood is from the hstrip that was processed immediately before the current one, 64 bits are needed to store it. So, it is arranged to retrieve only 1 codesegments' worth of data per access, not 2. This is the reason that there is no second read buffer stage for the top edge.

When an entire codeblock is finished and a new one is being started, the local SRAM 22 still contains significance and code control data from the just finished codeblock. All the significance bits are reset to 0 by muxing in 0's during the initial cleanup pass for the new codeblock, instead of using information from SRAM 22. This is depicted as the "0" mux inputs into the read buffers RDBUF 0 and 1.

FIG. 5 is a dataflow diagram for the computation of sign data. As discussed above, the context modeler 14 computes magnitude and sign decisions and contexts for every coefficient of a codeblock. The context modeler 14 computes sign decision and context for a codesegment in 2 stages referred in FIG. 5 as stage 0 and stage 1. Also, the context modeler 14 reads two codesegments simultaneously at "read buffers" RDBUF 0 and RDBUF 1. The context modeler 14 reads codesegments from left to right. In this illustrative embodiment, codesegments b3, b2, b1, b0, and bx, as shown in FIG. 3B, are those being processed for coding sign data. Also, hstrips a, b, and c are also those referred in FIG. 3B. The hstrips a and c provide the necessary neighborhood coefficients needed in computing sign decision and context. Sign data are data loaded from sign SRAM 28 into the pipe for buses SIGN_SRAM_OUTPUT.

Referring to FIG. 5, the sign data regarding codesegments b0 and bx are loaded from buses SIGN_SRAM_OUTPUT at RDBUF 1 and RDBUF 0, respectively. Given that codesegments b0 and bx are the rightmost codesegments and the context modeler 14 reads from left to right, sign data regarding codesegments b3, b2, and b1 have already been loaded and progressed up the stage in sequential fashion. In this case, codesegment b3 is completed and codesegments b2 and b1 are currently in active stages 1 and 0, respectively. As preceding codesegments complete processing, those codesegments remaining progress to the left one stage. At each stage, there are various computations and analysis done for each codesegment. Also, as each codesegment progresses to the left by one stage, the codesegment's top and bottom neighbors progress respectively. For example, at stage 1 where the codesegment b2 is being processed, the top neighbors (a2:12, 8, 4, 0) for codesegment b2 are also at stage 1 and bottom neighborhoods (c2:15, 11, 7, 3) are also at stage 1. The same is for codesegment b1 where its top neighbors sign data is at stage level 0.

In accessing sign data of top neighbors of a codesegment, the context modeler 14 uses three mechanized steps. The context modeler 14 uses RDBUF 1, stage 0 and 1. The top neighborhood utilizes several 1×4 memory arrays. These memory arrays allow for the storage and transitioning of data to the various points of accessing sign data in hstrip a. Each of the memory arrays 80, 82, and 84 also includes a multiplexer (MUX). The multiplexer provides the ability to maintain sign data associated with a codesegment or shift new inpu t into the arrays associated with a new codesegment.

At RDBUF 1, the context modeler 14 retrieves from the TOP-SIGN-REGISTER the top neighbors of the code segment at the same respective point in the processing occurring at hstrip b. Referring to FIG. 5, codesegment b0 is located at point RDBUF 1 in the processing of sign data at hstrip b, thus at the same point in the accessing of hstrip a sign data of top neighbors a0:12,8,4,0 are inputted into the memory array 80.

At stage 0, the memory array 82 acts like a buffer and stores the sign data received from RDBUF 1. This information will be passed on to the memory array 84 of stage 1.

At stage 1, the context modeler uses the sign data of the top neighbors stored in the memory array 84 for neighborhood generation for that codesegment that is also in stage 1 for the processing on the hstrip b. Referring to FIG. 5, the top neighbors a2:12, 8, 4, 0 are associated with the codesegment b2.

In processing the code segments in hstrip b, the context modeler 14 uses five different steps to process sign data for codesegments. In particular, the context modeler 14 uses two read buffers RDBUF 0 AND RDBUF 1. The read buffers RDBUF0, RDBUF1 include 4×4 memory arrays 86, 88, respectively. The memory arrays 86, 88 are designed to store a codesegment. In processing the hstrip b for sign data, two adjacent codesegments are loaded simultaneously. In this case, FIG. 5 demonstrates codesegment b0 being loaded in RDBUF 1 and codesegment bx being loaded in RDBUF 0. There are no systems in the prior art that loads two simultaneous codesegments in one clock. This alleviates the need for a dual-port local storage SRAM.

At stage 0 for the processing of sign data on hstrip b, the context modeler 14 shifts over the codesegment that was stored in RDBUF 1 and to the 4×4 memory array 90 in stage 0. The memory array 90 acts like a buffer and stores the sign data received from RDBUF 1. This information will be passed on to the memory array 92 of stage 1.

At stage 1 of sign data processing on hstrip b, the context modeler 14 shifts and stores the codesegment in stage 0 in its 4×4 memory array 92. The context modeler provides the new sign data by way of NEWSN bus. However, if the codesegment does not require any sign data coding, then no calculation of sign data for that codesegment is performed. Note that the multiplexer 94 of the memory array 92 in stage 1 receives three inputs NEWSN, codesegment sign data from stage 0, and 16 sign bits from memory buffer 6 of the initial CU pass. Also, the memory array 92 of stage 1 also outputs the new sign data to the sign SRAM 28 by way of bus SIGN_SRAM_INPUT. The memory array 92 also outputs bottom edge sign data to the bottom edge SRAM 30 by way of the BOTTOM_SIGN_SRAM_INPUT bus. Note that the bottom edge SRAM 30 gets the TOP edge sign data of the current hstrip and top edge REGISTER 32 get the bottom edge of the current hstrip. These edges will be used on the neighboring hstrips. Once stage 1 is finished performing its processing, stage 2 shifts out its current contents, and the current contents in stage 1 are shifted to stage 2 simultaneously. In this case, FIG. 5 demonstrates codesegment b2 in stage 1 where memory array 92 outputs to the top edge of codesegment b2 to the bottom edge SRAM 30 by way of the BOTTOM_SIGN_SRAM_INPUT bus. Also, the memory array 92 also outputs the bottom edge of codesegment b2 to the top edge Register 32 by way of the TOP_EDGE_REG_INPUT bus.

At stage 2 on hstrip b, the content that includes the codesegment in stage 1 that has been coded with sign data is received and stored in the memory array 96. The stage 2 is used to hold the previous codesegment's sign data information until there are 2 codesegments worth of data to write to the sign SRAM 28 and bottom edge SRAM 30 to avoid the requirement of a dual port SRAM. In this case, the codesegment b3 is in stage 2. The memory array 96 in stage 2 outputs it previously calculated sign data associated with codesegment b3 to the sign SRAM 28 and bottom sign data to the bottom edge SRAM 30. As shown, sign data associated with codesegment b3 is inputted to the sign SRAM 28 by way of the SIGN_SRAM_INPUT, and the bottom edge sign data is inputted to the bottom edge SRAM 28 by way of the bus BOTTOM_SIGN_SRAM_INPUT.

One difference to note is that the sign neighborhoods do not use diagonal neighbors, as in significance neighbors, so there is no need for extra flip-flops on the left-most top/bottom ends. Sign data gets read into this data stage from the memory buffer 6 once during initial cleanup and stored into the local SRAM 22 from the 16 sign bits from memory buffer 6 going into stage 1. From that point on, sign data is retrieved from the local SRAM 22 instead from memory buffer 6. During cleanup, there are a lot of clock cycles spent coding each and every magnitude bit of every codesegment. This means that there are plenty of clock cycles being used during initial cleanup. No subsequent passes are guaranteed to have any extra clock cycles, but by then the sign data is conveniently stored in local SRAM 22 and is retrieved in the manner as significance data with no need for wasting cycles to access memory buffer 6 again for sign data.

In accessing bottom edge sign data at hstrip c, the context modeler 14 uses 4 arrays to provide bottom edge sign data for computing sign data for a particular codesegment in stage 1 in the processing performed on hstrip b. These accesses are similar to those used in hstrip a and hstrip b. The accesses at hstrip c include two read buffers RDBUF 0 and RDBUF 1. Each of the read buffers RDBUF 0 and RDBUF 1 include 1×4 memory arrays 98, 100. The information provided to read buffers RDBUF 1 and RDBUF 0 is from the bottom edge SRAM 30. Each of these read buffer RDBUF 1 and RDBUF 0 receive bottom edge sign data of each codesegment that are in stages RDBUF 1 and RDBUF 0 in hstrip b, respectively, thus correlating the bottom edge sign data to its respective codesegment. FIG. 5 shows read buffer RDBUF 0 storing the bottom edge sign data of codesegment cx, wherein in hstrip b read RDBUF 0 stores codesegment bx. As the each codesegment shifts up the various stages in hstrip b, it associated bottom edge sign data also shifts in hstrip c. For example, in stage 0 in hstrip b contains the codesegment b1, while in stage 0 in hstrip c contains the bottom edge sign data for codesegment c1.

At stage 0, the memory array 101 acts like a buffer and stores the sign data received from RDBUF 1. This information will be passed on to the memory array 102 of stage 1.

At stage 1, the context modeler 14 uses the sign data of the bottom edge neighbors stored in the memory array 102 to compute new sign data for that codesegment that is also in stage 1 for the processing on the hstrip b. Referring to FIG. 5, the top neighbors a2:12, 8, 4, 0 and bottom neighbors c2:15, 11, 7, 3 are associated with the codesegment b2.

FIG. 6 is a dataflow diagram for providing code controls to codesegments. The arrangement in which the context modeler 14 processes code controls is similar to the processing done in computing significance and sign data. Code control is simply used to control what action takes place during the magnitude refinement pass. There is no concept of "neighborhood" for code control bits, so there is no need for top and bottom edge neighbors. The code control SRAM 26 is arranged similarly to the significance and sign: 2 codesegments' worth are retrieved for every access. The one difference is that each coefficient requires 2 bits instead of just 1.

In providing code controls, the context modeler 14 uses five different steps. In particular, the context modeler 14 uses two read buffers RDBUF 0 AND RDBUF 1. Each of the read buffers RDBUF 0, RDBUF 1 includes a 4×4 (×2 bits) memory arrays 106, 108, respectively. The memory arrays 106, 108 are designed to store a code control for a codesegment. In processing the hstrip b for code control data, code control for two adjacent codesegments are loaded simultaneously. In this case, FIG. 6 demonstrates code control for codesegment b0 being loaded in RDBUF 1 and code control for codesegment bx being loaded in RDBUF 0.

At stage 0, the context modeler 14 shifts over the codesegment that was stored in RDBUF 1 and to the 4×4 (×2 bits) memory array 109 in stage 0. That information will be passed on to stage 1. In this case, the FIG. 6 demonstrates code control for segment b1 is at stage 0.

At stage 1, the context modeler 14 shifts and stores the code control for codesegment in stage 0 in its 4×4 (×2 bits) memory array 110. The context modeler 14 provides code control data by way of NEWCC bus. Also, the memory array 110 of stage 1 also outputs the new code control data to the code control SRAM by way of bus CC_SRAM_INPUT. Once stage 1 is finished performing its processing, stage 2 shifts out its current contents, then the current contents in stage 1 are shifted to stage 2 simultaneously. In this case, FIG. 6 demonstrates code control for codesegment b2 in stage 1 where memory array 110 outputs to the code control for that code segment to the code control SRAM 26 by way of bus CC_SRAM_INPUT.

At stage 2, the content that includes the codesegment in stage 1 that has been coded with control data is received and stored in the memory array 112. Stage 2 is used to hold the previous codesegment's code control data information until there are 2 codesegments worth of data to write to the code control SRAM 26 to avoid the requirement of a dual port SRAM. In this case, the code control for codesegment b3 is in stage 2. The memory array 112 in stage 2 outputs it previously calculated code control data associated with codesegment b3 to the code control SRAM 26. As shown, code control data associated with codesegment b3 is inputted to the code control SRAM 26 by way of the CC_SRAM_INPUT.

Although the present invention has been shown and described with respect to several preferred embodiments thereof, various changes, omissions and additions to the form and detail thereof, may be made therein, without departing from the spirit and scope of the invention.

What is claimed is:

1. A system for compressing data of a codeblock from a memory buffer, said system comprising:
    a context modeler that receives from said memory buffer said codeblock and divides said codeblock into a plurality of codesegments, wherein each of said codesegments includes a plurality of bits, said context modeler processes each of said codesegments individually by determining whether any of said bits need special coding information, said context modeler outputs coded bits associated with said bits that are coded with said special coding information and context information associated with said coded bits; and
    an arithmetic coder that receives said context information and coded bits and compresses said coded bits.

2. The system of claim 1, wherein said special coding information is significance context and decision of a coefficient data.

3. The system of claim 1, wherein said special coding information is sign context and decision of a coefficient.

4. The system of claim 1, wherein said special coding information is code control data.

5. The system of claim 1, wherein the context modeler divides said codeblock into 4×4 codesegments.

6. The system of claim 2, wherein said context modeler uses three passes to code said bits with special coding information.

7. The system of claim 2, wherein said significance context and decision of a coefficient is computed using the significance of its neighbors.

8. The system of claim 3, wherein said sign context and decision of a coefficient is computed using the sign and significance of its neighbors.

9. The system of claim 1, wherein the context modeler accesses bitplanes of other codesegments for coding said special coding information.

10. A system for computing distortion of a codeblock associated with data from a memory buffer, said system comprising:
    a context modeler that receives from said memory buffer said codeblock divides said codeblock into a plurality of codesegments, wherein each of said codesegments includes a plurality of bits, said context modeler processes each of said codesegments individually by determining whether any of said bits need special coding information, and wherein said context modeler outputs coded bits associated with said bits that are coded with said special coding information, context information associated with said coded bits; and
    a codeblock attribute management unit that computes distortion metric for each of said codeblocks by summing values of said distortion metric of each of said coded bits associated with a codeblock.

11. The system of claim 10, wherein said special coding information is significance context and decision of a coefficient.

12. The system of claim 10, wherein said special coding information is sign context and decision of a coefficient.

13. The system of claim 10, wherein said special coding information is code control data.

14. The system of claim 10, wherein the context modeler divides said codeblock into 4×4 codesegments.

15. The system of claim 12, wherein said context modeler uses three passes to code said bits with special coding information.

16. The system of claim 12, wherein said significance context and decision of a coefficient is computed using the significance of its neighbors.

17. The system of claim 13, wherein said sign context and decision of a coefficient is computed using the sign and significance of its neighbors.

18. The system of claim 11, wherein the context modeler accesses bitplanes of other codesegments for coding said special coding information.

19. A method of compressing data of a codeblock associated with image data from memory buffer, said method comprises:

receiving said codeblock from said memory buffer;

dividing said codeblock into a plurality of codesegments, wherein each of said codesegments includes a plurality of bits, processing each of said codesegments individually by determining whether any of said bits need special coding information, outputting coded bits associated with said bits that are coded with said special coding information and context information associated with said coded bits; and compressing said coded bits using said context information.

20. The method of claim 19, wherein said special coding information is significance context and decision of a coefficient.

21. The method of claim 19, wherein said special coding information is sign context and decision of a coefficient.

22. The method of claim 19, wherein said special coding information is code control data.

23. The method of claim 19, wherein the context modeler divides said codeblock into 4×4 codesegments.

24. The method of claim 20, wherein said context modeler uses three passes to code said bits with special coding information.

25. The method of claim 20, wherein said significance context and decision of a coefficient is computed using the significance of its neighbors.

26. The method of claim 21, wherein said sign context and decision of a coefficient is computed using the sign and significance of its neighbors.

27. The method of claim 19, wherein the context modeler accesses bitplanes of other codesegments for coding said special coding information.

28. A method of computing distortion metric of a codeblock associated with image data from memory buffer, said method comprises:

receiving said codeblock from said memory buffer;

dividing said codeblock into a plurality of codesegments, wherein each of said codesegments includes a plurality of bits;

processing each of said codesegments individually by determining whether any of said bits need special coding information, outputting coded bits associated with said bits that are coded with said special coding information, context information associated with said coded bits; and computing distortion metric for each of said codeblocks by summing values of said distortion metric of each of said coded bits associated with a codeblock.

29. The method of claim 28, wherein said special coding information is significance context and decision of a coefficient.

30. The method of claim 28, wherein said special coding information is sign context and decision of a coefficient.

31. The method of claim 28, wherein said special coding information is code control data.

32. The method of claim 28, wherein the context modeler divides said codeblock into 4×4 codesegments.

33. The method of claim 30, wherein said context modeler uses three passes to code said bits with special coding information.

34. The method of claim 30, wherein said significance context and decision of a coefficient is computed using the significance of its neighbors.

35. The method of claim 31, wherein said sign context and decision of a coefficient is computed using the sign and significance of its neighbors.

36. The method of claim 28, wherein the context modeler accesses bitplanes of other codesegments for coding said special coding information.

37. A system for producing a codeblock, comprising:

an arithmetic coder that receives compressed data and context information decompresses so that it produces coded bits associated with a codesegment; and a context modeler that receives the coded bits and decodes the coded bits creating codesegments, said codesegments are outputted to a memory buffer.

* * * * *